United States Patent
Li et al.

(10) Patent No.: US 9,748,907 B2
(45) Date of Patent: Aug. 29, 2017

(54) OUTPUT IMPEDANCE-MATCHING NETWORK HAVING HARMONIC-PREVENTION CIRCUITRY

(71) Applicant: FREESCALE SEMICONDUCTOR, INC., Austin, TX (US)

(72) Inventors: Wenming Li, Chengdu (CN); Yunfei Wang, Chengdu (CN); Qi Wu, Chengdu (CN)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/139,336

(22) Filed: Apr. 27, 2016

(65) Prior Publication Data

US 2017/0054419 A1 Feb. 23, 2017

(30) Foreign Application Priority Data

Aug. 17, 2015 (CN) .......................... 2015 1 0659345

(51) Int. Cl.

| | |
|---|---|
| *H03F 1/56* | (2006.01) |
| *H03F 3/213* | (2006.01) |
| *H03F 1/26* | (2006.01) |
| *H03F 3/193* | (2006.01) |
| *H03F 3/195* | (2006.01) |

(52) U.S. Cl.
CPC .............. *H03F 1/565* (2013.01); *H03F 1/26* (2013.01); *H03F 3/193* (2013.01); *H03F 3/195* (2013.01); *H03F 3/213* (2013.01); *H03F 2200/225* (2013.01); *H03F 2200/391* (2013.01); *H03F 2200/451* (2013.01)

(58) Field of Classification Search
USPC .................................................. 330/302–307
See application file for complete search history.

(56) References Cited

U.S. PATENT DOCUMENTS

| 5,300,895 A * | 4/1994 | Jones ...................... H03F 3/191 330/251 |
| 6,177,834 B1 | 1/2001 | Blair |
| 7,372,334 B2 * | 5/2008 | Blair ...................... H01L 23/66 330/302 |

\* cited by examiner

*Primary Examiner* — Hieu Nguyen
(74) *Attorney, Agent, or Firm* — Charles E. Bergere (57) ABSTRACT

An output impedance-matching network for an RF power amplifier die includes a harmonic-prevention circuit that functions like a short circuit at a fundamental frequency of the amplifier and an open circuit at a second harmonic frequency of the amplifier. In certain implementations, the harmonic-prevention circuit has one or more parallel, reactive (LC) legs that resonate at the fundamental frequency and a parallel, reactive (capacitive) leg that causes the harmonic-prevention circuit to resonate at the second harmonic frequency. The harmonic-prevention circuit improves power transfer and efficiency of the RF power amplifier.

8 Claims, 9 Drawing Sheets

OUTPUT IMPEDANCE-MATCHING NETWORK HAVING HARMONIC-PREVENTION CIRCUITRY

BACKGROUND

The present invention relates to electronics and, more particularly, to output impedance-matching networks for RF power amplifiers and the like.

An RF power amplifier, for example, for a base station, is typically implemented with input and output impedance-matching networks respectively connected to the input and output nodes of the amplifier's active circuitry to match the input and output impedances of the RF power amplifier with the impedances of components respectively connected upstream and downstream of the RF power amplifier.

Figure 1:
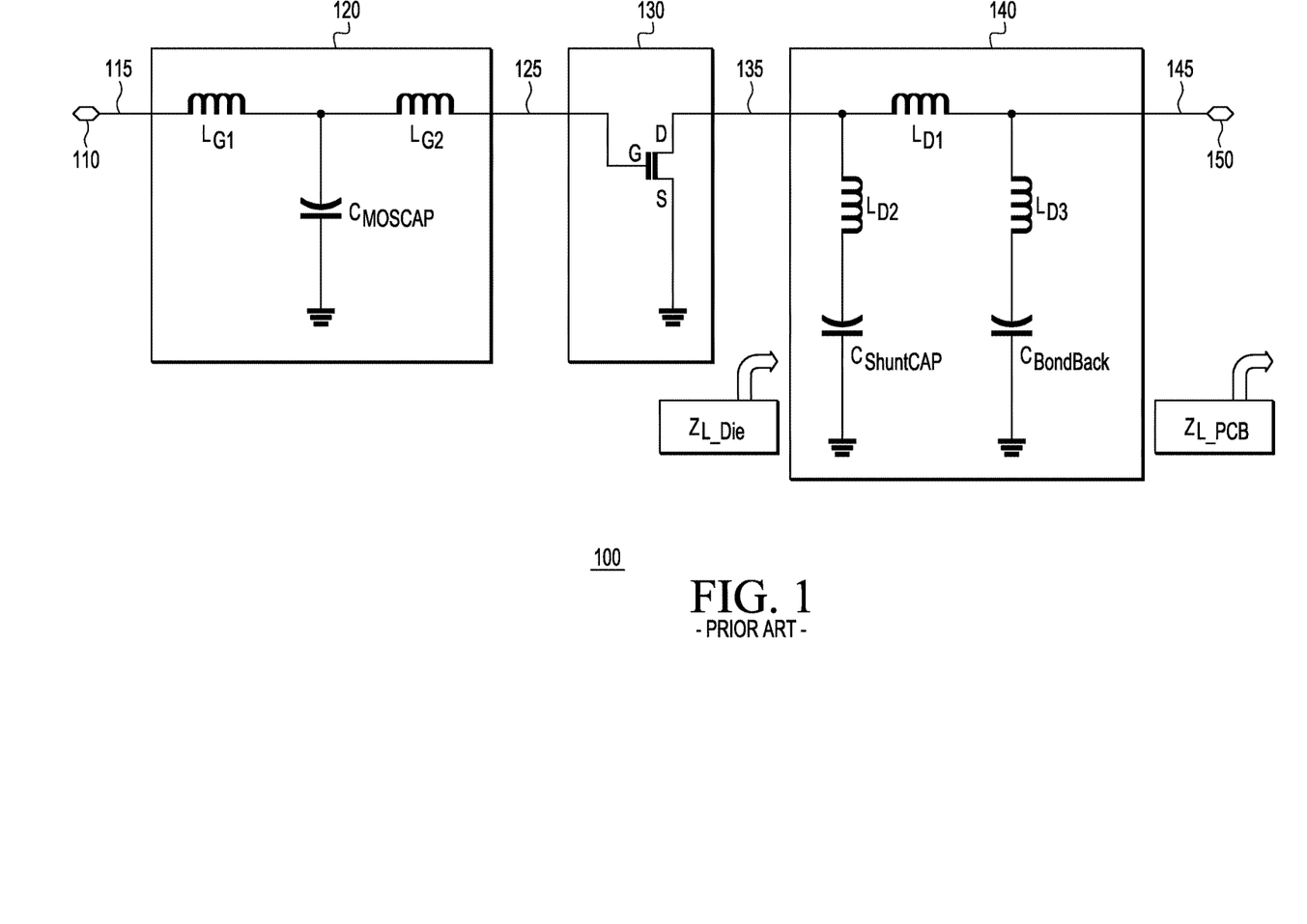
FIG. 1 is a schematic circuit diagram of a conventional, integrated RF power amplifier.

FIG. 1 is a schematic circuit diagram of a conventional, integrated RF power amplifier 100 having an input node 110 that receives an RF input signal 115 and presents a corresponding amplified RF output signal 145 at an amplifier output node 150. In particular, the RF input signal 115 at the amplifier input node 110 is applied to an input impedance-matching network 120, and a resulting filtered RF signal 125 is applied to the input (e.g., gate) of an active device 130. A resulting amplified RF signal 135 at the output (e.g., drain) of the active device 130 is applied to an output impedance-matching network 140, and the resulting filtered RF signal, i.e., the amplified RF output signal 145, is presented at the amplifier output node 150. Although the active device 130 is represented in FIG. 1 as a single power transistor, the active device 130 is sometimes also implemented using more involved active circuitry comprising a suitable configuration of multiple transistors and other electronic components.

As shown in FIG. 1, the conventional input impedance-matching network 120 comprises inductances $L_{G1}$ and $L_{G2}$ and capacitor $C_{MOSCAP}$. Similarly, the conventional output impedance-matching network 140 comprises inductor $L_{D1}$, $L_{D2}$, and $L_{D3}$ and capacitors $C_{ShuntCAP}$ and $C_{Bondback}$ which represent the capacitances of discrete shunt capacitors. The capacitance value of $C_{Bondback}$ is usually tens of times larger than the capacitance value of $C_{ShuntCAP}$. The leg comprising the series connection of the inductor $L_{D2}$ and the capacitor $C_{ShuntCAP}$ functions like a pure inductor at the fundamental frequency $\omega$, while the leg comprising the series connection of the inductor $L_{D3}$ and the capacitor $C_{Bondback}$ functions like a pure capacitor at the fundamental frequency $\omega$. The output impedance $Z_{L\_Die}$ of the RF power amplifier 100 die is given by Equation (1) as follows:

$$Z_{L_{Die}} = \left(R_{D2} + j\left(\omega L_{D2} - \frac{1}{\omega C_{ShuntCAP}}\right)\right) // \\ \left[(R_{D1} + j\omega L_{D1}) + \left(R_{D3} + j\left(\omega L_{D3} - \frac{1}{\omega C_{Bondback}}\right)\right)\right] // Z_{L\_PCB} \quad (1)$$

where:
  $\omega$ is the frequency (in radians per second) of the amplified RF signal 135;
  $R_{D1}$, $R_{D2}$, and $R_{D3}$ are the inherent resistances associated with the inherent inductors $L_{D1}$, $L_{D2}$, and $L_{D3}$, respectively; and
  $Z_{L\_PCB}$ is the circuit impedance seen by the RF power amplifier 100 at its output node 150, which is substantially dependent on the downstream component(s) configured, for example, on a printed circuit board (PCB) on which the RF power amplifier chip is mounted.

In some implementations, the resonant frequency of the series combination of the inductance $L_{D3}$ and the capacitance $C_{Bondback}$ substantially matches the second harmonic frequency of the amplified RF signal 135. In that case, the RF power amplifier 100 will operate with both reduced power and reduced efficiency.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, an article of manufacture comprises an amplifier comprising active circuitry and an output impedance-matching network connecting an output of the active circuitry to an output node of the amplifier to provide a desired output impedance for the amplifier, wherein the output impedance-matching network comprises a harmonic-prevention circuit that functions as (i) a short circuit at a fundamental frequency of the amplifier and (ii) an open circuit at a second harmonic of the amplifier's fundamental frequency.

Figure 2:
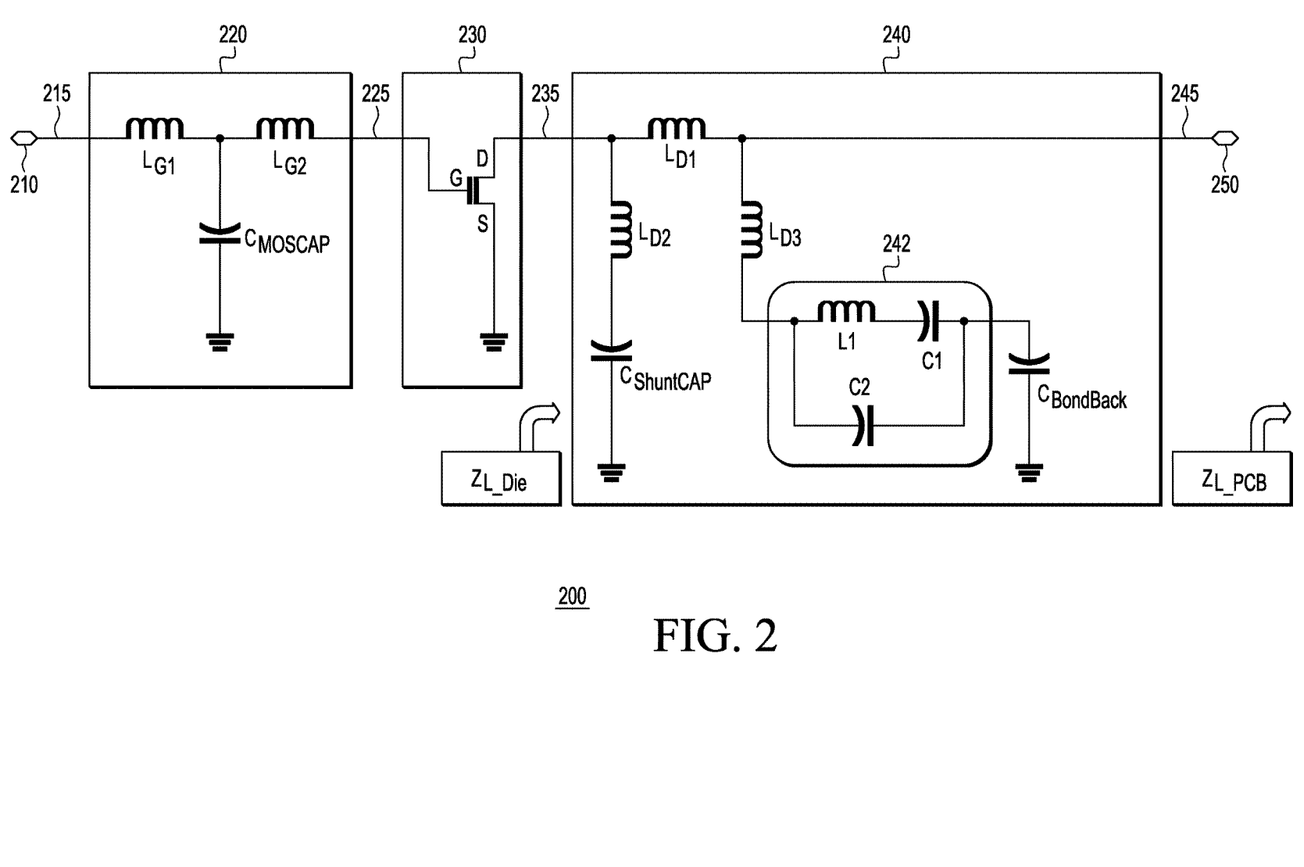
FIG. 2 is a schematic circuit diagram of an integrated RF power amplifier according to one embodiment of the invention.

FIG. 2 is a schematic circuit diagram of an integrated RF power amplifier 200, according to one embodiment of the invention, having an input node 210 that receives an RF input signal 215 and presents a corresponding amplified RF output signal 245 at an amplifier output node 250. As with the conventional RF power amplifier 100 of FIG. 1, the RF input signal 215 at the amplifier input node 210 is applied to an input impedance-matching network 220, and a resulting filtered RF signal 225 is applied to an active device 230. A resulting amplified RF signal 235 is applied to an output impedance-matching network 240, and the resulting filtered RF signal is presented at the output node 250 as the amplified RF output signal 245.

The input impedance-matching network 220 of FIG. 2 may be identical to the conventional input impedance-matching network 120 of FIG. 1, and the active device 230 of FIG. 2 may be identical to the conventional active device 130 of FIG. 1. The output impedance-matching network 240 of FIG. 2 may be similar to the conventional output impedance-matching network 140 of FIG. 1, except that the output impedance-matching network 240 also includes a harmonic-prevention circuit 242, which comprises (i) inductance $L_1$, which represents the inductance of a discrete inductor and (ii) capacitances $C_1$ and $C_2$, which represent the capacitances of two discrete capacitors. The series combination of the inductor $L_1$ and the capacitor $C_1$ form a first reactive (i.e., LC) leg, while the capacitor $C_2$ forms a second reactive (i.e., capacitive) leg. The output impedance $Z_{L\_Die}$ of the RF power amplifier 200 die is given by Equation (2) as follows:

$$Z_{L\_Die} = \left(R_{D2} + j\left(\omega L_{D2} - \frac{1}{\omega C_{ShuntCAP}}\right)\right) // \quad (2)$$
$$[(R_{D1} + j\omega L_{D1}) + (R_{D3} + jX_{equ}) // Z_{L\_PCB}]$$

where:
ω is the frequency (in radians per second) of the amplified RF signal 235; and $$X_{equ} = \omega L_{D3} + \left[\left(\omega L_1 - \frac{1}{\omega C_1}\right) // \frac{-1}{\omega C_2}\right] - \frac{1}{\omega C_{Bondback}}.$$

The harmonic-prevention circuit 242 is specifically designed to achieve two operating characteristics:
(1) The first reactive leg (i.e., the series combination of the inductor $L_1$ and the capacitor $C_1$) resonates at the fundamental frequency ω such that the first reactive leg functions like a short circuit at the fundamental frequency ω and a pure inductor for signals at the second harmonic frequency; and
(2) The parallel combination of (i) the first reactive leg and (ii) the second reactive leg (i.e., the capacitor $C_2$) resonates at the second harmonic of the fundamental frequency ω, which creates an open circuit at the second harmonic frequency.

For the fundamental frequency $F_0$ (in Hz, where $\omega = 2\pi F_0$), to achieve those two operating characteristics, the inductance $L_1$ and the capacitance $C_2$ may be defined in terms of the capacitance $C_1$ according to Equations (3) and (4) as follows:

$$L_1 = \frac{1}{4\pi^2 F_0^2 C_1} \quad (3)$$

$$C_2 = \frac{C_1}{3} \quad (4)$$

The effect of those two operating characteristics is that the harmonic-prevention circuit 242 functions as (i) a short circuit at the fundamental frequency and (ii) an open circuit at the second harmonic frequency. As such, the harmonic-prevention circuit 242 allows most of the fundamental-frequency energy to pass to the output node 250, while blocking most of the second-harmonic-frequency energy from reaching the output node 250 by preventing the drain of the active device 230 from being pre-matched to the second harmonic bad area from the point of view of the impedance matching. As a result, the RF power amplifier 200 of FIG. 2 is able to operate with lower power loss and greater efficiency than the conventional RF power amplifier 100 of FIG. 1.

Figure 3:
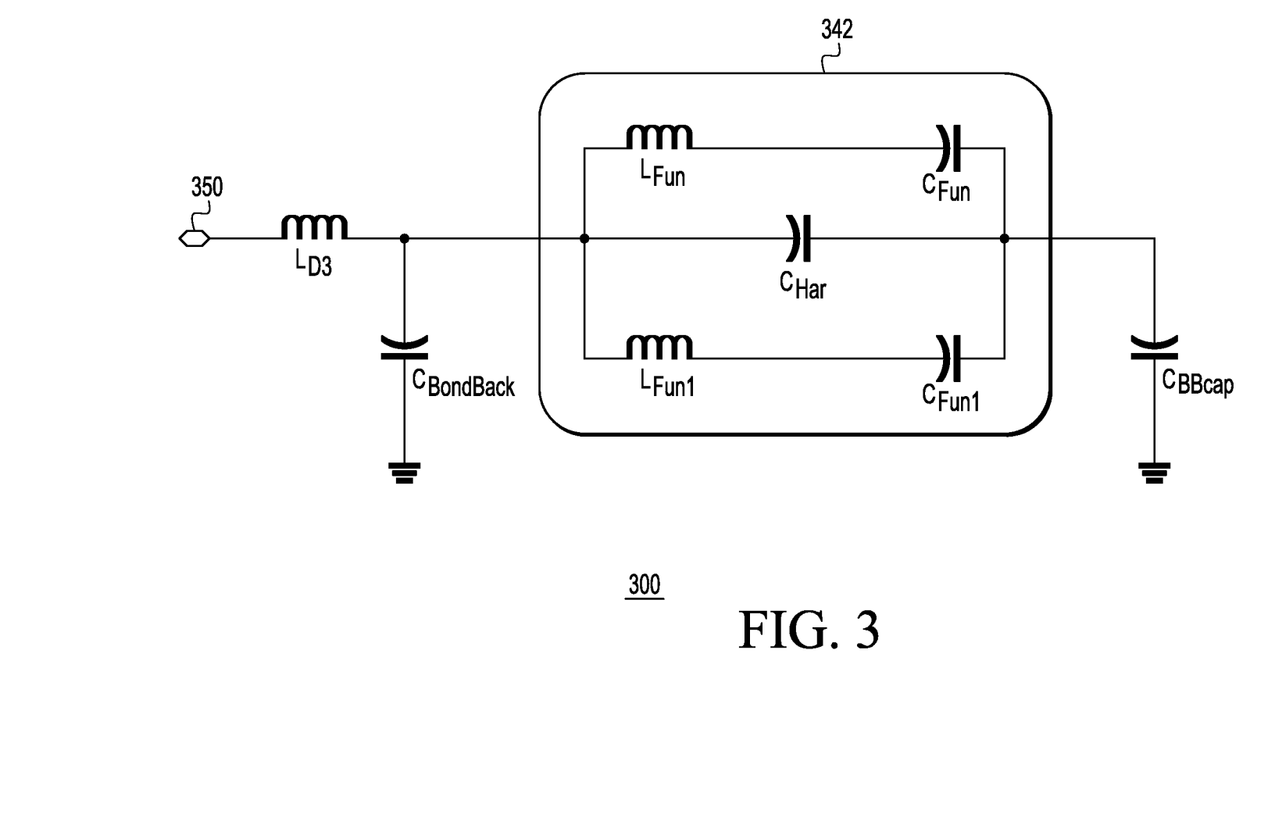
FIG. 3 is a schematic circuit diagram of a portion of an output impedance-matching network according to an embodiment of the invention.

FIG. 3 is a schematic circuit diagram of a portion of an output impedance-matching network CF, according to another embodiment of the invention. The portion shown in FIG. 3 corresponds to the portion of the output impedance-matching network 240 of FIG. 2 consisting of the inductance $L_{D3}$, the harmonic-prevention circuit 242, and the capacitance $C_{Bondback}$. In this embodiment, the harmonic-prevention circuit 242 of FIG. 2 is replaced by the harmonic-prevention circuit 342 of FIG. 3, and the capacitance $C_{Bondback}$ is represented in FIG. 3 by two capacitances: $C_{Bondpad}$, which represents the inherent capacitance of the bond pad, and $C_{BBcap}$, which represents the capacitance of a discrete shunt capacitor.

As shown in FIG. 3, the harmonic-prevention circuit 342 comprises (i) inductances $L_{Fun}$ and $L_{Fun1}$, which represent the inductances of two discrete inductors and (ii) capacitances $C_{Fun}$, $C_{Fun1}$, and $C_{Har}$, which represent the capacitances of three discrete capacitors. The series combination of the inductor $L_{Fun}$ and the capacitor $C_{Fun}$ form a first reactive (i.e., LC) leg, the capacitor $C_{Har}$ forms a second reactive (i.e., capacitive) leg, and the series combination of the inductor $L_{Fun1}$ and the capacitor $C_{Fun1}$ form a third reactive (i.e., LC) leg. Note that, in some, but not necessarily all, implementations, $L_{Fun} = L_{Fun1}$ and $C_{Fun} = C_{Fun1}$. Similar to the harmonic-prevention circuit 242, the harmonic-prevention circuit 342 is specifically designed to achieve three operating characteristics:
(1) The first reactive leg (i.e., the series combination of the inductor $L_{Fun}$ and the capacitor $C_{Fun}$) resonates at the fundamental frequency ω; and
(2) The third reactive leg (i.e., the series combination of the inductor $L_{Fun1}$ and the capacitor $C_{Fun1}$) resonates at the fundamental frequency ω; and
(3) The parallel combination of (i) first reactive leg, (ii) the second reactive leg (i.e., the capacitor $C_{Har}$, and (iii) the third reactive leg resonates the second harmonic of the fundamental frequency ω.

Here, too, the effect of those three operating characteristics is that the harmonic-prevention circuit 342 functions as (i) a short circuit at the fundamental frequency and (ii) an open circuit at the second harmonic frequency. As such, like the harmonic-prevention circuit 242 of FIG. 2, the harmonic-prevention circuit 342 allows most of the fundamental-frequency energy to pass to the output node 350, while blocking most of the second-harmonic-frequency energy from reaching the output node 350. As a result, like the RF power amplifier 200 of FIG. 2, an RF power amplifier having the harmonic-prevention circuit 342 of FIG. 3 is able to operate with lower power loss and greater efficiency than the conventional RF power amplifier 100 of FIG. 1.

Figure 4:
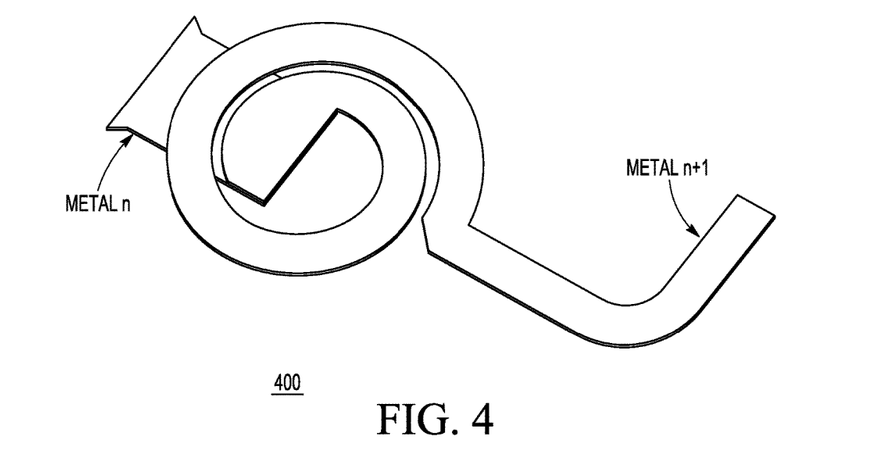
FIG. 4 is a perspective view of a structure that can be used to implement the inductor $L_{Fun}$ of FIG. 3.

FIG. 4 is a perspective view of a structure 400 that can be used to implement the inductor $L_{Fun}$ of FIG. 3. In one embodiment, the structure 400 is formed using two metal layers of a standard IC (integrated circuit) process, and in one example, a 676 pH inductance at 1.86 GHz with 1.5 turns circular spiral metal line was achieved. It should be noted that the turns is the number of spiral metal line and equivalent inductance would be different when operating frequency or the structure 500 is changed. More specifically, the equivalent inductance of the structure 400 of FIG. 4 (and the equivalent capacitance of the structure 500 of FIG. 5) must comply with equation (3). It will be understood that the inductor $L_{Fun1}$ of FIG. 3 can be implemented using the same or an analogous structure.

Figure 5:
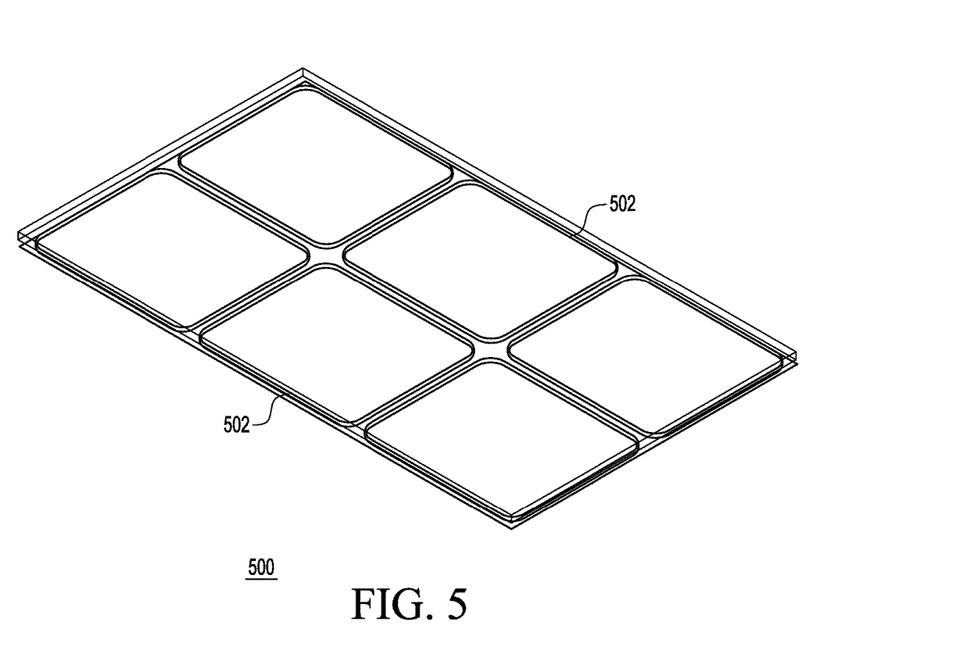
FIG. 5 is a perspective view of a structure that can be used to implement each of the capacitors $C_{Fun}$ and $C_{Fun1}$ of FIG. 3.

FIG. 5 is a perspective view of an example structure 500 that can be used to implement the capacitors $C_{Fun}$ and $C_{Fun1}$ of FIG. 3, where the structure 500 is realized by two parallel metal plates. In one embodiment, the metal plates had a size of 238 um×138 um (l×w), which achieved a 10.8 PF equivalent capacitance at 1.86 GHz with six parallel instances of a basic capacitor element 502. It will be understood that the required number of parallel instances could be changed to maintain the total equivalent capacitance if the basic capacitor element 502 size is changed, and that the corresponding equivalent capacitance of the structure 500 should comply with equation (3) if a specific operating frequency or the structure 400 of FIG. 4 is changed.

Figure 6:
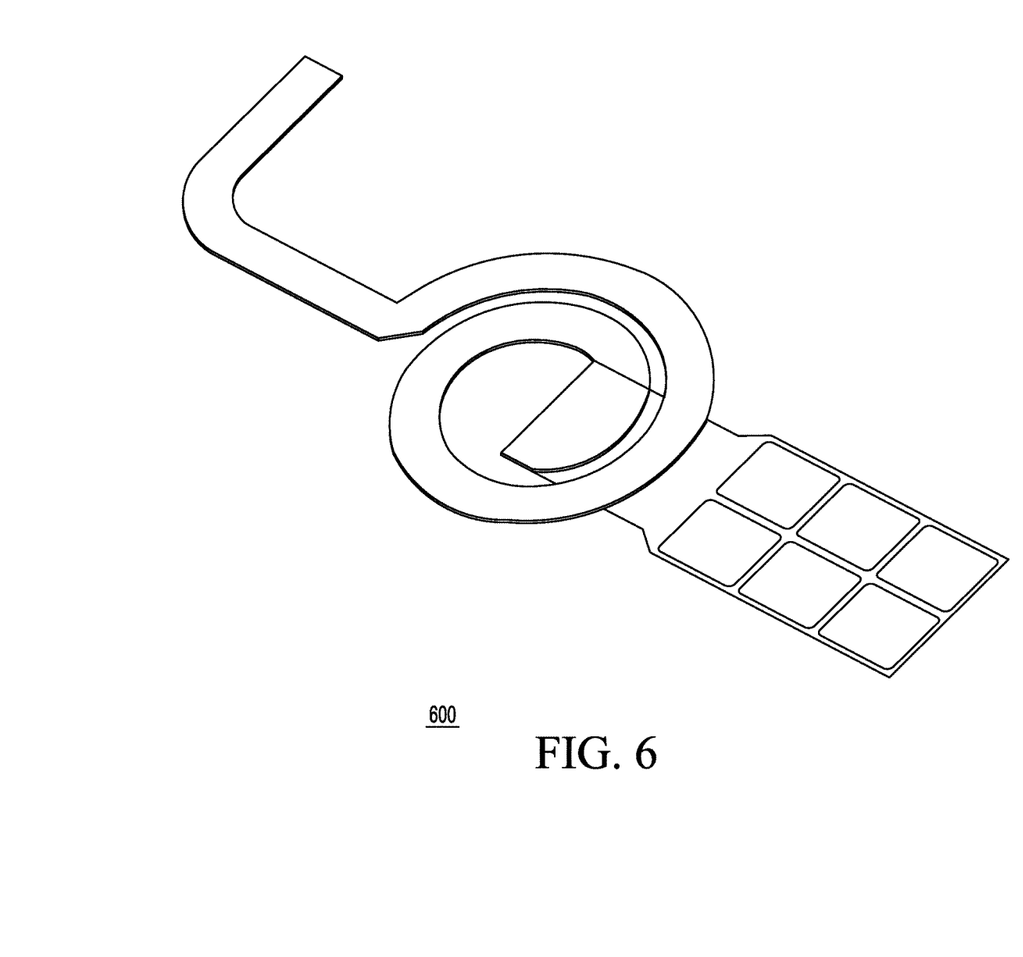
FIG. 6 is a perspective view of a structure resulting from the series combination of the structures of FIGS. 4 and 5.

FIG. 6 is a perspective view of a structure 600 resulting from the series combination of the structure 400 of FIG. 4 and the structure 500 of FIG. 5, which is realized by connecting the metal-n of structure 400 of FIG. 4 to the bottom metal plate of the structure 500 of FIG. 5. As such, the structure 600 can be used to implement the series combination of the inductor $L_{Fun}$ and the capacitor $C_{Fun}$ of FIG. 3. It will be understood that the series combination of the inductor $L_{Fun1}$ and the capacitor $C_{Fun1}$ of FIG. 3 can be implemented using the same or an analogous structure.

Figure 7:
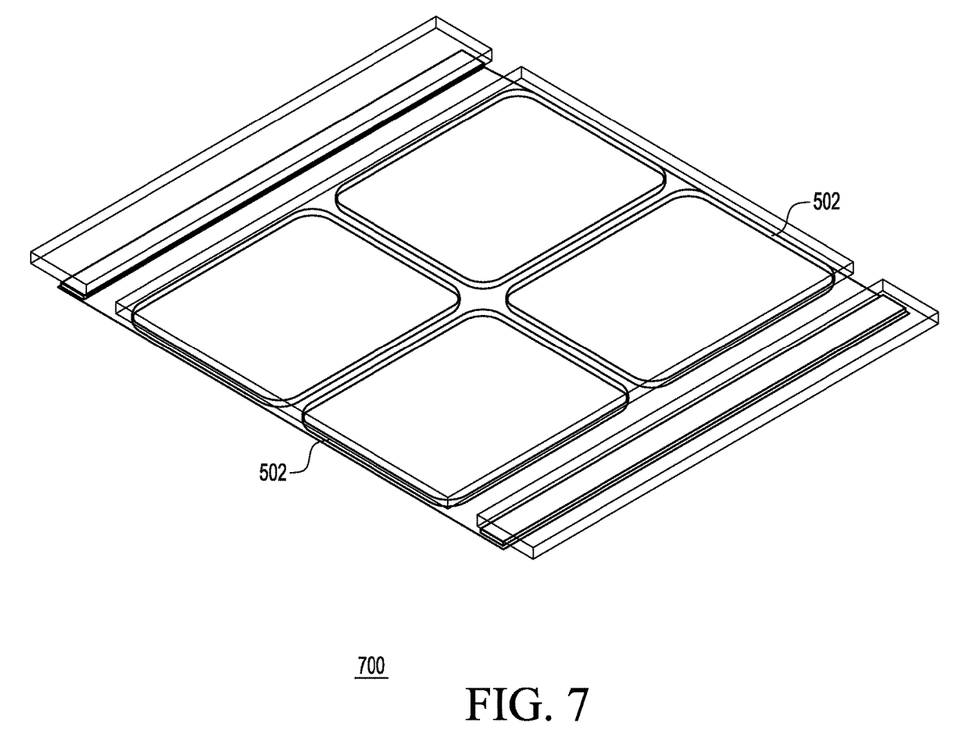
FIG. 7 is a perspective view of a structure that can be used to implement the capacitor $C_{Har}$ of FIG. 3.

FIG. 7 is a perspective view of a structure 700 that can be used to implement the capacitor $C_{Har}$ of FIG. 3, where the structure 700 is realized by two parallel metal plates. In one embodiment, the metal plates had a size of 137 um×112 um (l×w), which achieved a 5.08 PF equivalent capacitance at 1.86 GHz for a specific 1.8 GHz application. It will be understood that the specific metal plate size would be changed if the operating frequency or the structure 400 of FIG. 4 changed.

Figure 8:
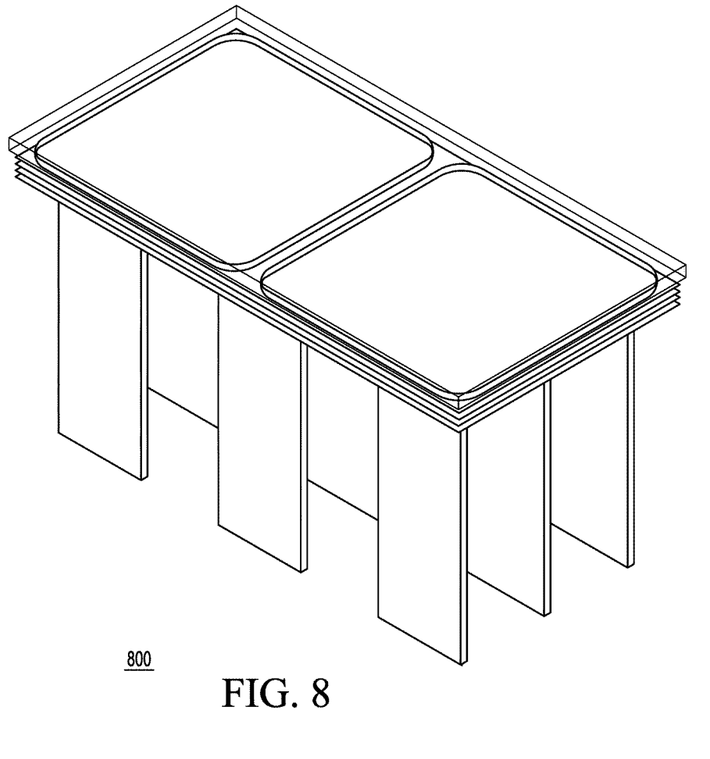
FIG. 8 is a perspective view of a structure that can be used to implement half of the shunt capacitor $C_{BBcap}$ of FIG. 3.

FIG. 8 is a perspective view of a structure 800 that can be used to implement half of the shunt capacitor $C_{BBcap}$ of FIG. 3. The structure 800 is realized by two parallel metal plates, and the bottom metal plate would be connected to ground using vias.

Figure 9:
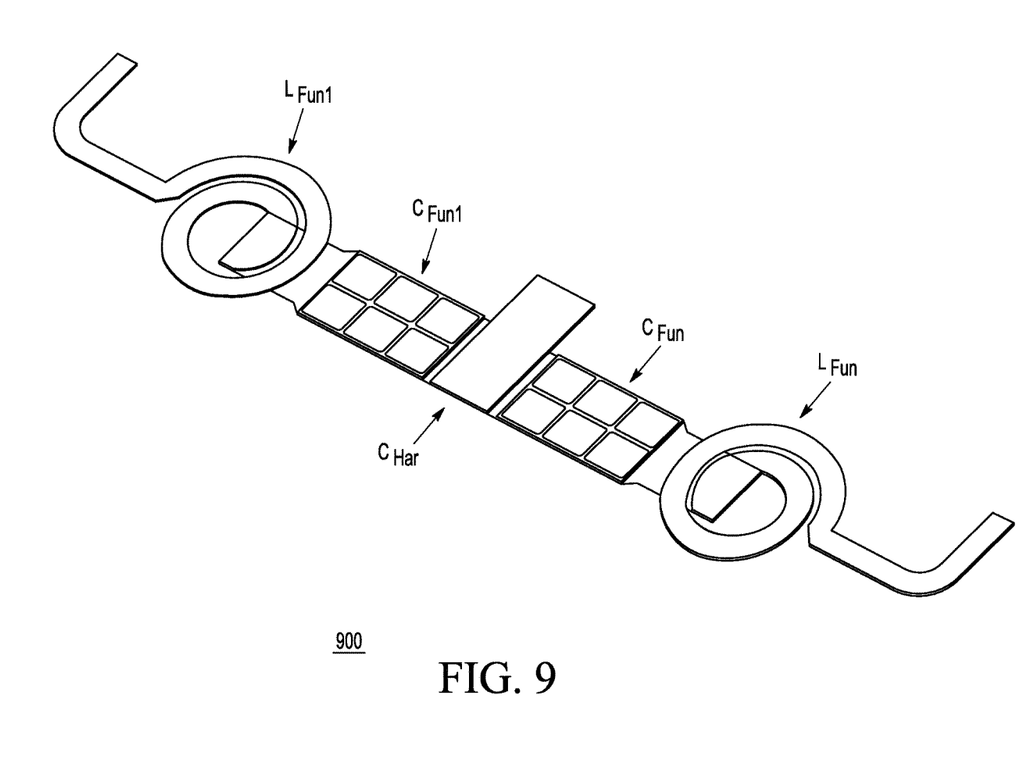
FIG. 9 is a perspective view of a structure corresponding to the harmonic-prevention circuit of FIG. 3.

FIG. 9 is a perspective view of a structure 900 corresponding to the harmonic-prevention circuit 342 of FIG. 3. In particular, the structure 900 is implemented using the structure 600 of FIG. 6 for the series combination of the inductor $L_{Fun}$ and the capacitor $C_{Fun}$ of FIG. 3, a structure analogous to the structure 600 for the series combination of the inductor $L_{Fun1}$ and the capacitor $C_{Fun1}$ of FIG. 3, and the structure 700 of FIG. 7 for the capacitor $C_{Har}$ of FIG. 3.

Figure 10:
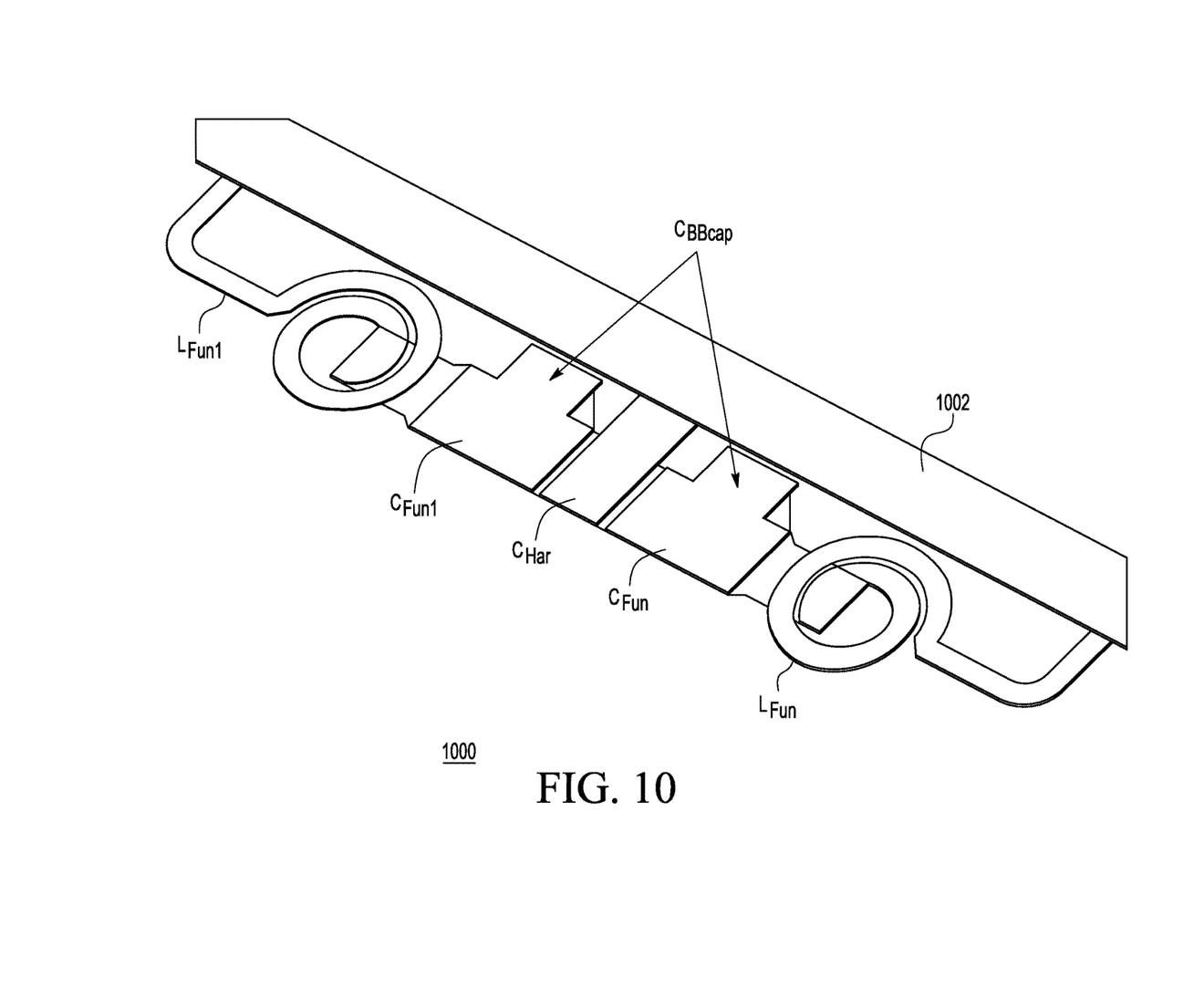
FIG. 10 is a perspective view of a structure corresponding to the capacitances $C_{Bondpad}$ and $C_{BBcap}$ and the harmonic-prevention circuit of FIG. 3.

FIG. 10 is a perspective view of a structure 1000 corresponding to the configuration of the capacitances $C_{Bondpad}$ and $C_{BBcap}$ and the harmonic-prevention circuit 342 of FIG. 3. In particular, the structure 1000 is implemented using (i) two instances of the structure 800 of FIG. 8 for the shunt capacitor $C_{BBcap}$ and (ii) the structure 900 of FIG. 9 for the harmonic-prevention circuit 342. Note that the capacitance $C_{Bondpad}$ is the inherent capacitance of the bond pad 1002.

Although the harmonic-prevention circuit 342 has been described as being implemented using the specific structures shown in FIG. 10, those skilled in the art will understand that many different structures may be used to implement the various components of the harmonic-prevention circuit 342.

Although the invention has been described in the context of the specific harmonic-prevention circuits 242 and 342, in general, any circuit that functions as (i) a short circuit at the amplifier's fundamental frequency and (ii) an open circuit at the amplifier's second harmonic frequency can be used as a harmonic-prevention circuit in the output impedance-matching network of an RF power amplifier to achieve analogous results. Those skilled in the art will understand that there are many different combinations of electronic components that will achieve those functional results.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding terminals, nodes, ports, or paths may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal-oxide semiconductor (MOS) transistor device (also referred to as a MOSFET), the term "channel" refers to the path through the device between the source and the drain, and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi-polar device when an embodiment of the invention is implemented using bi-polar transistor technology.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An article of manufacture including an amplifier, comprising:
    active circuitry;
    an output impedance-matching network connecting an output of the active circuitry to an output node of the amplifier to provide a desired output impedance for the amplifier, wherein the output impedance-matching network comprises a harmonic-prevention circuit that functions as (i) a short circuit at a fundamental frequency of the amplifier and (ii) an open circuit at a second harmonic of a fundamental frequency of the amplifier; and
    a lead connected between the output of the active circuitry and the output node of the amplifier,
    wherein the output impedance-matching network further comprises (i) a first shunt capacitor connected to the lead and (ii) a second shunt capacitor connected to the harmonic-prevention circuit, and
    wherein the harmonic-prevention circuit comprises:
        a first reactive leg having a resonant frequency substantially equal to the fundamental frequency of the amplifier;
        a second reactive leg connected in parallel with the first reactive leg such that the harmonic-prevention circuit has a resonant frequency substantially equal to a second harmonic frequency of the fundamental frequency of the amplifier; and
        a third reactive leg (i) connected in parallel with the first and second reactive legs and (ii) having a resonant frequency substantially equal to the fundamental frequency of the amplifier.

2. The article of claim 1, wherein:
    the amplifier is an integrated RF power amplifier die; and
    the amplifier further comprises an input impedance-matching network connecting an input node of the amplifier to an input of the active circuitry.

3. The article of claim 1, wherein:
    the first reactive leg comprises a first-leg inductor connected in series with a first-leg capacitor; and
    the second reactive leg comprises a second-leg capacitor.

4. The article of claim 1, wherein:
    the first reactive network leg functions substantially as a pure inductor at the second harmonic frequency; and
    the second reactive leg functions substantially as a pure capacitor at the second harmonic frequency.

5. The article of claim 1, wherein the third reactive leg comprises a third-leg inductor connected in series with a third-leg capacitor.

6. The article of claim 5, wherein:
    the first-leg inductor and the third-leg inductor have substantially equal inductances; and
    the first-leg capacitor and the third-leg capacitor have substantially equal capacitances.

7. An article of manufacture including an amplifier, comprising:
    active circuitry; and
    an output impedance-matching network connecting an output of the active circuitry to an output node of the amplifier to provide a desired output impedance for the amplifier, wherein the output impedance-matching network comprises a harmonic-prevention circuit that functions as (i) a short circuit at a fundamental frequency of the amplifier and (ii) an open circuit at a second harmonic of a fundamental frequency of the amplifier, wherein:
    the amplifier is an integrated RF power amplifier die;
    the amplifier further comprises an input impedance-matching network connecting an input node of the amplifier to an input of the active circuitry;
    the harmonic-prevention circuit comprises:
        a first reactive leg having a resonant frequency substantially equal to the fundamental frequency of the amplifier, wherein the first reactive leg (i) comprises a first-leg inductor connected in series with a first-leg capacitor and (ii) functions substantially as a pure inductor at the second harmonic frequency;
        a second reactive leg connected in parallel with the first reactive leg such that the harmonic-prevention circuit has a resonant frequency substantially equal to a second harmonic frequency of the fundamental frequency of the amplifier, wherein the second reactive leg (i) comprises a second-leg capacitor and (ii) functions substantially as a pure capacitor at the second harmonic frequency; and
        a third reactive leg (i) connected in parallel with the first and second reactive legs and (ii) having a resonant frequency substantially equal to the fundamental frequency of the amplifier;
    the harmonic-prevention circuit is connected between the output of the active circuitry and the output node of the amplifier;
    a lead connects the output of the active circuitry to the harmonic-prevention circuit; and
    the output impedance-matching network further comprises (i) a first shunt capacitor connected to the lead and (ii) a second shunt capacitor connected to the harmonic-prevention circuit.

8. The article of claim 7,
    wherein the third reactive leg comprises a third-leg inductor connected in series with a third-leg capacitor;
    the first-leg inductor and the third-leg inductor have substantially equal inductances; and
    the first-leg capacitor and the third-leg capacitor have substantially equal capacitances.

* * * * *